United States Patent
Rassekh et al.

(10) Patent No.: US 10,839,120 B2
(45) Date of Patent: Nov. 17, 2020

(54) COMMUNICATION AT THE SPEED OF LIGHT OVER AN ON-CHIP INTERCONNECT

(71) Applicants: Amin Rassekh, Tehran (IR); Reza Sarvari, Tehran (IR); Sina Shahhosseini, Tehran (IR)

(72) Inventors: Amin Rassekh, Tehran (IR); Reza Sarvari, Tehran (IR); Sina Shahhosseini, Tehran (IR)

(73) Assignee: SHARIF UNIVERSITY OF TECHNOLOGY, Tehran (IR)

( * ) Notice: Subject to any disclaimer, the term of this patent is extended or adjusted under 35 U.S.C. 154(b) by 0 days.

(21) Appl. No.: 16/280,365

(22) Filed: Feb. 20, 2019

(65) Prior Publication Data
US 2019/0179975 A1  Jun. 13, 2019

Related U.S. Application Data

(60) Provisional application No. 62/633,091, filed on Feb. 21, 2018.

(51) Int. Cl.
*G06F 30/33* (2020.01)
*G06F 30/327* (2020.01)

(52) U.S. Cl.
CPC .......... *G06F 30/327* (2020.01); *G06F 30/33* (2020.01)

(58) Field of Classification Search
CPC . H01L 2224/32225; H01L 2224/48227; H01L 2224/73265; H01L 2924/1306; H01L 2224/73253; H01L 2924/13062; H01L 27/14806; H01L 2224/16146; H01L 2224/16227; H01L 2224/16235; H01L 27/11; H01L 27/11898; H01L 27/1214; H01L 2924/01002; H01L 27/3281; H01L 2224/131; H01L 2924/1305; H01L 2924/13091; H01L 2924/3011; H01L 21/76898; H01L 27/0207; H01L 27/0688; H01L 27/10894; H01L 27/1266; H01L 27/14603; H01L 29/0673; H01L 29/7889; H01L 23/64; H01L 24/85; G11C 11/54;
(Continued)

(56) References Cited

U.S. PATENT DOCUMENTS 6,347,393 B1  2/2002 Alpert et al.
6,553,338 B1  4/2003 Buch et al.
(Continued)

OTHER PUBLICATIONS

El-Moursy et al. "Optimum wire sizing of RLC interconnect with repeaters." Integration, the VLSI journal 38, No. 2 (2004): 205-225.
Ismail et al. "Effects of inductance on the propagation delay and repeater insertion in VLSI circuits." IEEE Transactions on Very Large Scale Integration (VLSI) Systems 8, No. 2 (2000): 195-206.
Saini et al. "An Alternate Approach to Buffer Insertion for Delay and Power Reduction in VLSI Interconnects." Journal of Low Power Electronics 6, No. 3 (2010): 429-435.
(Continued)

*Primary Examiner* — Binh C Tat
(74) *Attorney, Agent, or Firm* — Bajwa IP Law Firm; Haris Zaheer Bajwa

(57) ABSTRACT

A method for communication at the speed of light over an on-chip interconnect is disclosed. The method includes dividing an on-chip interconnect into a plurality of segments. Each of the plurality of segments includes a transmission line and a tapered buffer. The tapered buffer is connected to the transmission line. An input capacitance of the tapered buffer satisfies a capacitance condition. A driver resistance of the tapered buffer satisfies a resistance condition.

18 Claims, 14 Drawing Sheets

(58) Field of Classification Search
CPC . G11C 13/0023; G11C 13/0011; G11C 11/21; G11C 13/004; G11C 27/005; A61B 2017/00017; A61B 2090/065; A61B 2017/00327; A61B 5/061; A61B 2017/00818; A61B 2034/2051; A61B 17/1222; A61B 17/32; A61B 17/0682; A61B 5/0066; A61B 5/0022; A61B 2090/3735; A61B 5/6847; G06F 1/163; G06F 3/012; G06F 3/013; G06F 1/12; G06F 30/327; G06F 30/33; G01N 27/122; G16H 50/20; G16H 50/50; Y10S 977/775; Y10S 977/938; A61M 2205/3368; A61M 2230/205
USPC .................................................. 716/100–106
See application file for complete search history.

(56) References Cited

U.S. PATENT DOCUMENTS

| | | | |
|---|---|---|---|
| 7,013,438 | B1 | 3/2006 | Saldanha et al. |
| 7,676,780 | B2 | 3/2010 | Alpert et al. |
| 7,877,719 | B2 | 1/2011 | He |
| 2005/0088246 | A1* | 4/2005 | Wood .................. G06F 1/10 331/57 |
| 2012/0298411 | A1* | 11/2012 | Dutta .................. H01L 23/473 174/264 |

OTHER PUBLICATIONS

Pamunuwa et al. "Repeater insertion to minimise delay in coupled interconnects." in VLSI Design 2001. Fourteenth International Conference on VLSI Design, pp. 513-517. IEEE, 2001.

Karimi et al. "Buffer insertion for delay minimization using an improved PSO algorithm." Applied Mathematics & Information Sciences 8, No. 5 (2014): 2277.

Cherkauer et al. "Design of tapered buffers with local interconnect capacitance." IEEE Journal of Solid-State Circuits 30, No. 2 (1995): 151-155.

Alpert et al. "Simultaneous driver sizing and buffer insertion using a delay penalty estimation technique." IEEE Transactions on computer-aided design of integrated circuits and systems 23, No. 1 (2004): 136-141.

Alizadeh et al. "On temperature dependency of delay for local, intermediate, and repeater inserted global copper nterconnects." IEEE Transactions on Very Large Scale Integration (VLSI) Systems 23, No. 12 (2015): 3143-3147.

Akl et al. "Reducing interconnect delay uncertainty via hybrid polarity repeater insertion." IEEE Transactions on Very Large Scale Integration (VLSI) Systems 16, No. 9 (2008): 1230-1239.

Alpert et al. "Buffer insertion for noise and delay optimization." IEEE Transactions on Computer-Aided Design of Integrated Circuits and Systems 18, No. 11 (1999): 1633-1645.

* cited by examiner

COMMUNICATION AT THE SPEED OF LIGHT OVER AN ON-CHIP INTERCONNECT

CROSS-REFERENCE TO RELATED APPLICATION

This application claims the benefit of priority from U.S. Provisional Patent Application Ser. No. 62/633,091, filed on Feb. 21, 2018, and entitled "COMMUNICATION AT THE SPEED OF LIGHT (CASOL) OVER ON-CHIP METAL GLOBAL INTERCONNECTS," which is incorporated herein by reference in its entirety.

TECHNICAL FIELD

The present disclosure generally relates to integrated circuits, and particularly, to interconnects.

BACKGROUND

As transistors benefit from scaling, interconnects may become a limiter for giga-scale integration (GSI). Although with technology scaling a minimum feature size may become smaller, a die size may increase due to having more functionality on a chip. Hence, technology scaling may result in an increase in both length and number of global lines, which may reduce communication speed. Moreover, with scaling a critical dimension (CD), process variations may affect performance, power, and yield. On the other hand, the interconnect variability may aggravate with technology scaling. There is, therefore, a need for a method for increasing the communication speed over on-chip interconnects that is robust against process variations.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary method for communication at the speed of light over an on-chip interconnect. An exemplary method may include dividing an on-chip interconnect into a plurality of segments. Each of the plurality of segments may include a transmission line and a tapered buffer. In an exemplary embodiment, the tapered buffer may be connected to the transmission line. An input capacitance of the tapered buffer may satisfy a capacitance condition. In an exemplary embodiment, a driver resistance of the tapered buffer may satisfy a resistance condition.

An exemplary method may further include determining a size of the tapered buffer by determining a size of a plurality of cascaded buffers. An exemplary method may further include setting a size of a first buffer of the plurality of cascaded buffers to 1.

In an exemplary embodiment, determining the size of the plurality of cascaded buffers may include determining a size of a plurality of cascaded inverters. An inverter of the plurality of cascaded inverters may include a pair of transistors. In an exemplary embodiment, each transistor of the pair of transistors may include one of a metal-oxide-semiconductor field-effect transistor (MOSFET) and a fin field-effect transistor (FinFET). In an exemplary embodiment, determining the size of a plurality of cascaded inverters may include designing the FinFET according to a 7 nanometer (nm) technology node.

An exemplary method may further include determining an optimized length of the transmission line by minimizing a ratio of a delay of the transmission line to a time of flight over the on-chip interconnect with respect to a length of the transmission line. An exemplary method may further include setting the length of the transmission line in a range between the optimized length and an upper limit corresponding to 10% higher than the minimized ratio of the delay of the transmission line to the time of flight.

An exemplary method may further include setting an aspect ratio of the on-chip interconnect to one half and placing the on-chip interconnect on a layer of a plurality of layers. In an exemplary embodiment, the layer may include a plurality of parallel interconnects. An exemplary method may further include setting a distance between the on-chip interconnect and an adjacent interconnect of the plurality of parallel interconnects equivalent to a width of the on-chip interconnect and setting a distance between the on-chip interconnect and an adjacent layer of the plurality of layers equivalent to a height of the on-chip interconnect.

In an exemplary embodiment, the present disclosure describes an integrated circuit for communication at the speed of light over an on-chip interconnect. An exemplary integrated circuit may include a plurality of layers. In an exemplary embodiment, a layer of the plurality of layers may include a plurality of parallel on-chip interconnects. An on-chip interconnect of the plurality of parallel on-chip interconnects may include a plurality of segments. In an exemplary embodiment, each of the plurality of segments may include a transmission line and a tapered buffer. A length of the transmission line may be determined according to a delay condition. The delay condition may include a ratio of a delay of the transmission line to a time of flight over the on-chip interconnect minimized with respect to a length of the transmission line.

In an exemplary embodiment, the tapered buffer may be connected to the transmission line. In an exemplary embodiment, the tapered buffer may include a plurality of cascaded buffers. In an exemplary embodiment, each of the plurality of cascaded buffers may include an inverter. The inverter may include a pair of transistors. In an exemplary embodiment, each transistor of the pair of transistors may include one of a MOSFET and a FinFET.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure.

The present disclosure is not intended to be limited to the implementations shown, but is to be accorded the widest possible scope consistent with the principles and features disclosed herein.

Herein is disclosed exemplary methods and integrated circuits for communication at the speed of light over on-chip interconnects. An exemplary method may include dividing an on-chip interconnect into a number of segments, wherein each segment includes a tapered buffer connected to a transmission line (TL). Specifications of the tapered buffer (including number and size of cascaded buffers, and input capacitance and driver resistance of each buffer) may be determined in a range so that certain conditions for communication at the speed of light are satisfied. An optimum length of the TL may be then obtained to minimize delay of the TL.

Buffer insertion for communication at the speed of light may not only enable data communication at the material's speed limit with a high bit-rate but also may be robust against crosstalk noise and process variations. Low-swing signaling in these conditions may restore electrical wires as a competitor to their optical counterparts, both in terms of power and delay.

Figure 1:
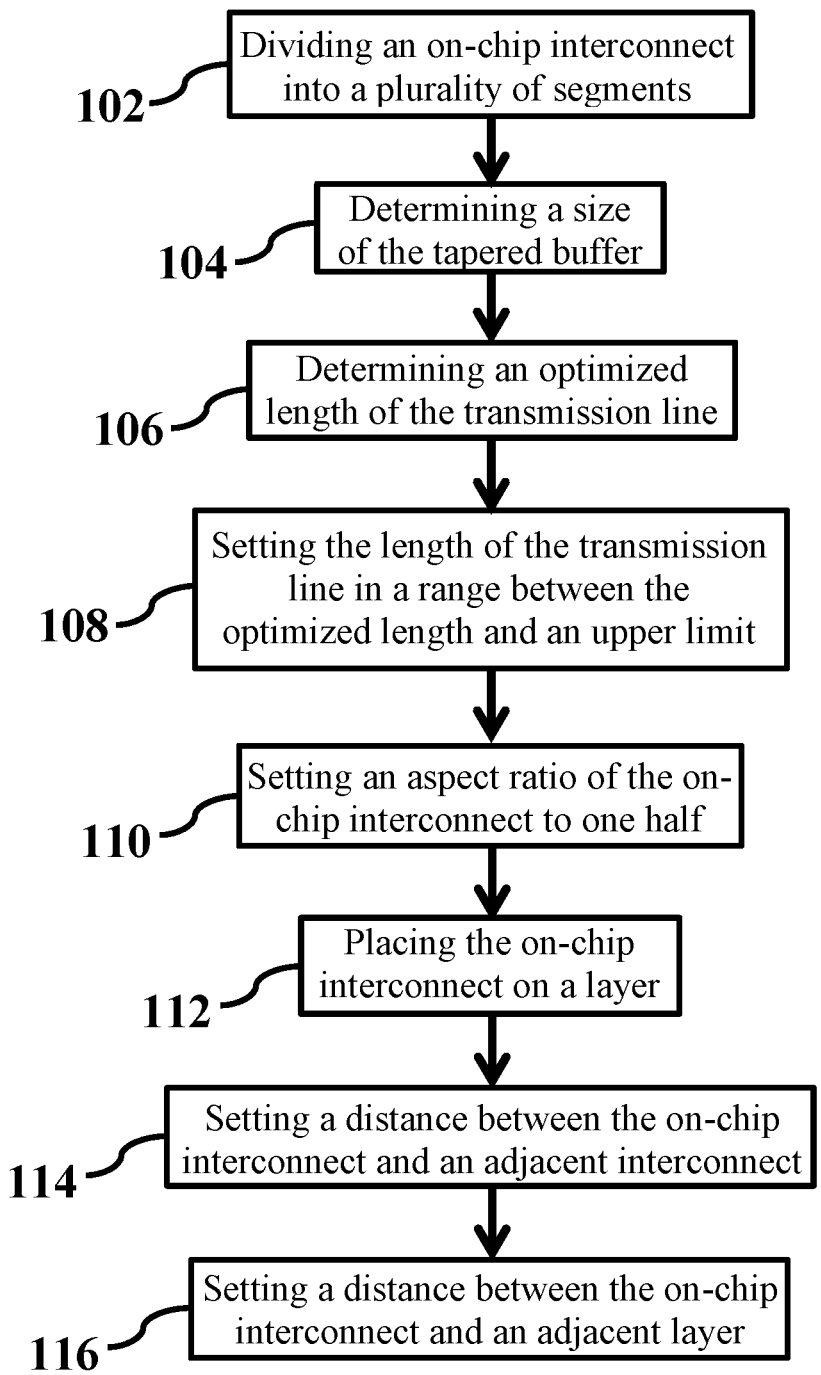
FIG. 1 shows a flowchart of a method for communication at the speed of light over an on-chip interconnect, consistent with one or more exemplary embodiments of the present disclosure.

FIG. 1 shows a flowchart of a method for communication at the speed of light over an on-chip interconnect, consistent with one or more exemplary embodiments of the present disclosure. An exemplary method 100 may include dividing an on-chip interconnect into a plurality of segments (step 102). Each of the plurality of segments may include a transmission line and a tapered buffer. In an exemplary embodiment, the tapered buffer may be connected to the transmission line. An input capacitance of the tapered buffer $C_L$ may satisfy a capacitance condition according to an operation defined by $Z_0 < 0.1 \times T_F/C_L$, where $Z_0$ is a characteristic impedance of the on-chip interconnect, and $T_F$ is a time of flight over the on-chip interconnect.

Figure 2:
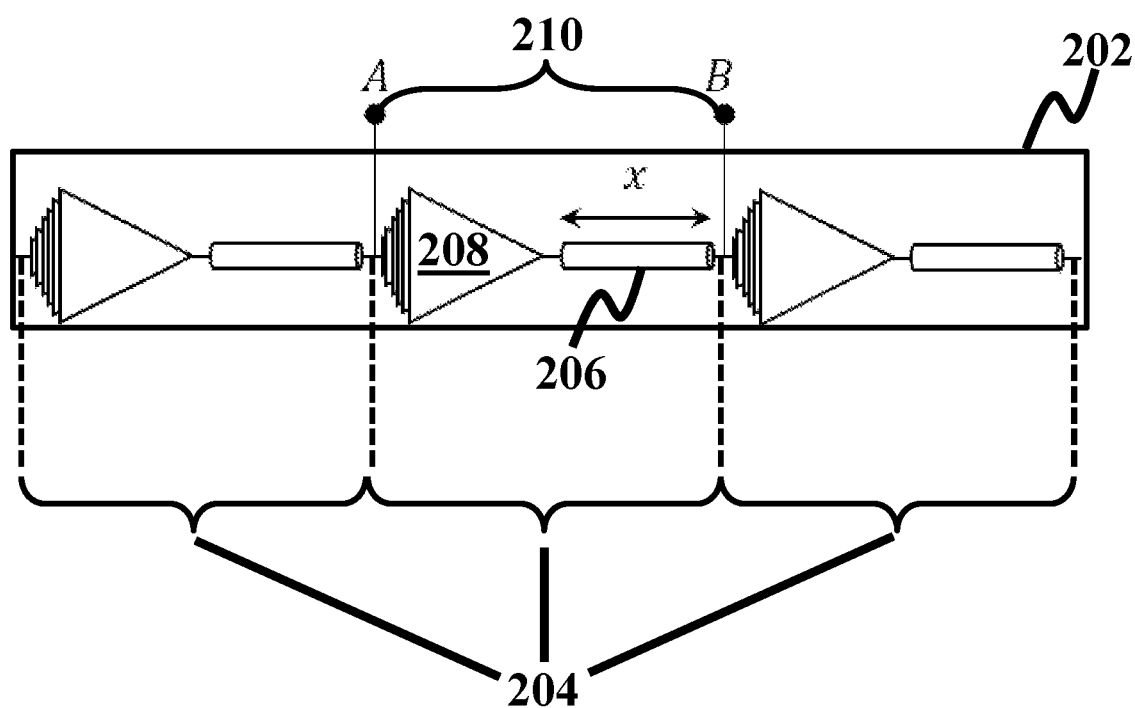
FIG. 2 shows a schematic of an integrated circuit for communication at the speed of light over an on-chip interconnect, consistent with one or more exemplary embodiments of the present disclosure.

In further detail with respect to step 102, FIG. 2 shows a schematic of an integrated circuit for communication at the speed of light over an on-chip interconnect, consistent with one or more exemplary embodiments of the present disclosure. In an exemplary embodiment, different steps of method 100 may be implemented by utilizing an exemplary integrated circuit 200. In an exemplary embodiment, integrated circuit 200 may include an on-chip interconnect 202 and a plurality of segments 204. Each of plurality of segments 204 may include a transmission line 206 and a tapered buffer 208. In an exemplary embodiment, in each respective segment of plurality of segments 204, tapered buffer 208 may be connected to transmission line 206.

Figure 3:
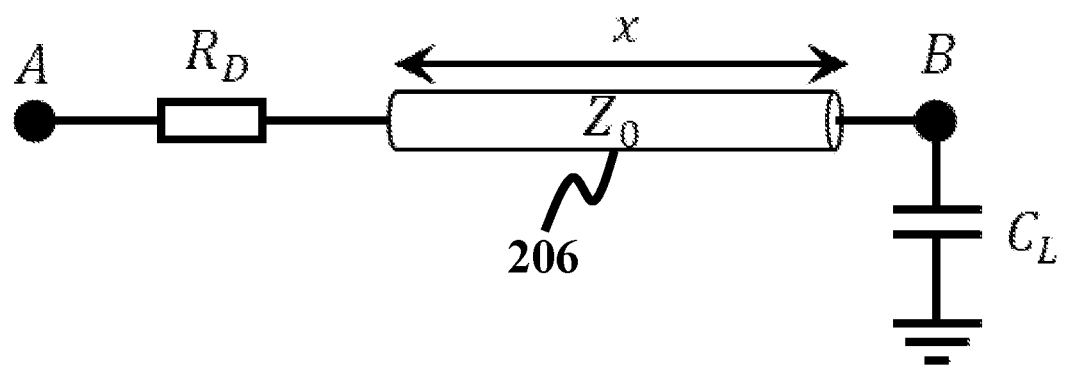
FIG. 3 shows a schematic of an RLC model of a segment of an integrated circuit, consistent with one or more exemplary embodiments of the present disclosure.

For further detail with regards to method 100, FIG. 3 shows a schematic of an RLC model of a segment 210 (from node A to node B in the schematic of FIG. 2) of In an exemplary embodiment, integrated circuit 200, consistent with one or more exemplary embodiments of the present disclosure. In an exemplary embodiment, transmission line 206 may be modeled by characteristic impedance $Z_0$, a tapered buffer that drives transmission line 206 may be modeled by a driver resistance $R_D$ of tapered buffer 208, and a tapered buffer that is driven by transmission line 206 may be modeled by input capacitance $C_L$.

In an exemplary embodiment, the capacitance condition may ensure that input capacitance $C_L$ may become so small as the technology node scales down that transmission line 206 may be considered as an open-ended transmission line. In other words, when a load impedance (at a frequency of interest) is much larger than characteristic impedance $Z_0$, the capacitance condition may be satisfied. In an exemplary embodiment, such reduction of $C_L$ may cause a jump in the voltage level at the end of transmission line 206.

In an exemplary embodiment, driver resistance $R_D$ of tapered buffer 208 may satisfy a resistance condition according to an operation defined by $R_D<3Z_0$. The resistance condition may be derived based on the voltage jump at the end of transmission line 206, which may be estimated as $2Z_0V_{DD})/(Z_0+R_D)$ by neglecting an attenuation due to the line resistance, where $V_{DD}$ is a supply voltage of tapered buffer 208. Therefore, in an exemplary embodiment, keeping $R_D$ smaller than $3Z_0$ may enable data communication at the speed of light.

Referring again to FIG. 1, in an exemplary embodiment, method 100 may further include determining a size of the tapered buffer by determining a size of a plurality of cascaded buffers (step 104) according to a recursive operation defined by $S_i=h \times S_{i-1}$, where i is an integer number and $1<i \leq N$ where N is the number of the plurality cascaded buffers, $S_i$ is a size of an $i^{th}$ buffer of the plurality of cascaded buffers, and $h>1$ is a taper ratio. In other words, in an exemplary embodiment, each of the plurality of cascaded buffers may be h times larger than a previous buffer.

Figure 4:
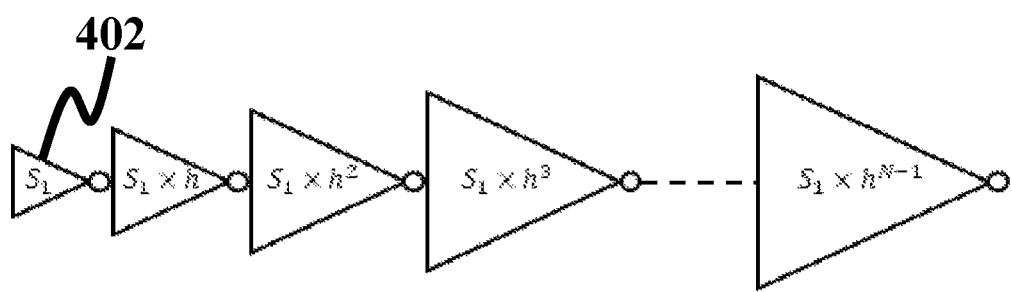
FIG. 4 shows a schematic of a plurality of cascaded buffers, consistent with one or more exemplary embodiments of the present disclosure.

For further detail with respect to step 104, FIG. 4 shows a schematic of an exemplary plurality of cascaded buffers, consistent with one or more exemplary embodiments of the present disclosure. In an exemplary embodiment, tapered buffer 208 may include a plurality of cascaded buffers 400. According to the recursive operation, size $S_i$ of the $i^{th}$ buffer may be given by $S_i=S_1 \times h^{i-1}$, where $S_1$ is a size of a first buffer 402 of plurality of cascaded buffers 400, which may herein after be also referred to as the minimum-sized buffer. In an exemplary embodiment, method 100 may further include setting size $S_1$ of first buffer 402 to 1.

In an exemplary embodiment, determining the size of plurality of cascaded buffers 400 in step 104 may include determining a size of a plurality of cascaded inverters. An exemplary inverter of the plurality of cascaded inverters may include a pair of transistors. In an exemplary embodiment, each transistor of the pair of transistors may include one of a metal-oxide-semiconductor field-effect transistor (MOSFET) and a fin field-effect transistor (FinFET).

Figure 5:
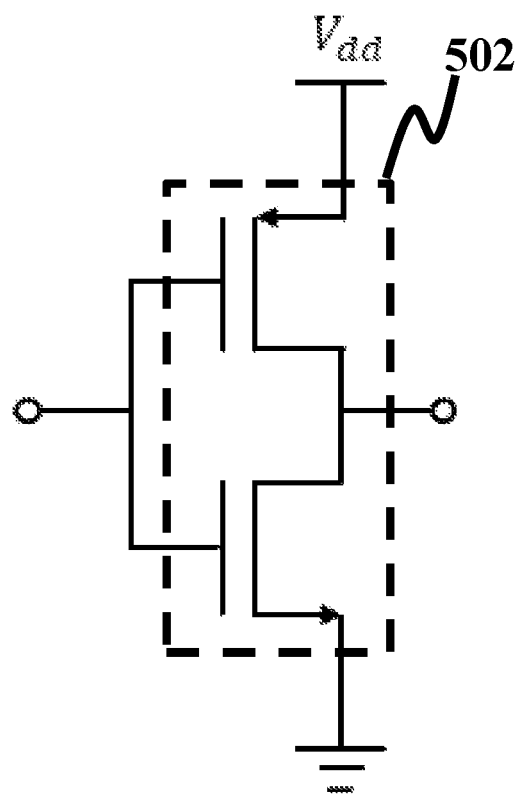
FIG. 5 shows a schematic of an exemplary inverter, consistent with one or more exemplary embodiments of the present disclosure.

In further detail with regards to step 104, FIG. 5 shows a schematic of an exemplary inverter, consistent with one or more exemplary embodiments of the present disclosure. An exemplary inverter 500 may include a pair of transistors 502. Each transistor of pair of transistors 502 may include one of a MOSFET and a FinFET. For a MOSFET, the inverter size may be defined as the aspect ratio (width to length) of the transistor gate. For a FinFET, the inverter size may be defined as the number of fins of the transistor. In an exemplary embodiment, determining the size of the plurality of cascaded inverters may include designing the FinFET according to a 7 nanometer (nm) technology node.

In an exemplary embodiment, driver resistance $R_D$ may be empirically estimated as $R_D=R_0/h^{n-1}$, where $R_0$ is the driver resistance of the minimum-sized inverter. As a result, in an exemplary embodiment, for the 7 nm FinFET technology, the resistance condition of $R_D<3Z_0$ may translate into $h^{N-1}>100$. Therefore, in an exemplary embodiment, the taper ratio may satisfy a taper condition according to $h^{N-1}>100$.

Referring again to FIGS. 1 and 2, in an exemplary embodiment, method 100 may further include determining an optimized length $x_{opt}$ of transmission line 206 by minimizing a ratio of a delay $\tau$ of transmission line 206 to time of flight $T_F$ over on-chip interconnect 202 with respect to a length x of transmission line 206 (step 108). As discussed above, if the resistance condition of $R_D<3Z_0$ is satisfied, in an exemplary embodiment, the dependency of delay $\tau$ on taper ratio h and number N of plurality of cascaded buffers 400 may be negligible. Hence, an optimal solution for $\tau/T_F$ may be obtained by scanning different lengths of transmission line 206 and finding optimized length $x_{opt}$ at which ratio $\tau/T_F$ may be minimized.

In an exemplary embodiment, optimized length $x_{opt}$ may be used for determining a range of length x of transmission line 206. Therefore, in an exemplary embodiment, method 100 may further include setting length x of transmission line 206 in a range between optimized length $x_{opt}$ and an upper limit corresponding to about 10% higher than the minimized ratio of delay $\tau$ of transmission line 206 to the time of flight $T_F$. In other words, in an exemplary embodiment, an about 10% deviation in $\tau/T_F$ from the minimized value may be tolerable for determining length x. This deviation range may be helpful for dividing on-chip interconnect 202 with a fixed length imposed by a technology node. For dividing on-chip interconnect 202 into plurality of segments 204 with equal lengths, in an exemplary embodiment, a same value of length x may be found for all of plurality of segments 204 corresponding to the 10% deviation range from the minimized value of $\tau/T_F$ for each of plurality of segments 204. For $x>x_{opt}$, the line attenuation may become dominant, whereas for $x<x_{opt}$, the buffer delay may become dominant. Length x may be selected larger than $x_{opt}$ to save Silicon area and reduce power dissipation by a delay penalty, whereas choosing x around or smaller than $x_{opt}$ may result in a more robust design.

Referring again to FIG. 1, in an exemplary embodiment, method 100 may further include setting an aspect ratio of the on-chip interconnect to about one half (step 110) and placing the on-chip interconnect on a layer of a plurality of layers (step 112). In an exemplary embodiment, the layer may include a plurality of parallel interconnects. In an exemplary embodiment, method 100 may further include setting a distance between the on-chip interconnect and an adjacent interconnect of the plurality of parallel interconnects equivalent to a width of the on-chip interconnect (step 114) and setting a distance between the on-chip interconnect and an adjacent layer of the plurality of layers equivalent to a height of the on-chip interconnect (step 116).

Figure 6:
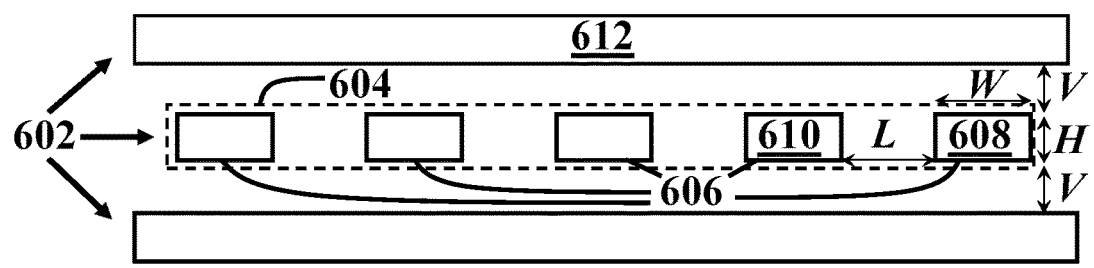
FIG. 6 shows a schematic of a global wiring system, consistent with one or more exemplary embodiments of the present disclosure.

In further detail with regards to steps 110-116, FIG. 6 shows a schematic of a global wiring system, consistent with one or more exemplary embodiments of the present disclosure. In an exemplary embodiment, steps 110-116 may be implemented utilizing an exemplary global wiring system 600. In an exemplary embodiment, global wiring system 600 may include a plurality of layers 602. An exemplary layer 604 of plurality of layers 602 may include a plurality of parallel on-chip interconnects 606. In an exemplary embodiment, step 110 may include setting an aspect ratio of an exemplary on-chip interconnect 608 of plurality of parallel on-chip interconnects 606 to about one half. In an exemplary embodiment, setting the wire's aspect ratio to about one half may aid in cancelling crosstalk noise. This may lead to the communication at the speed of light for out-of-phase switching with no overshoot for in-phase signals.

In an exemplary embodiment, step 112 may include placing on-chip interconnect 608 on layer 604. In an exemplary embodiment, step 114 may include setting a distance L between on-chip interconnect 608 and an adjacent interconnect 610 of plurality of parallel on-chip interconnects 606 equivalent to a width W of on-chip interconnect 608. In an exemplary embodiment, step 116 may include setting a distance V between on-chip interconnect 608 and an adjacent layer 612 of plurality of layers 602 equivalent to a height H of on-chip interconnect 608.

Process variations and crosstalk noise may become challenging concerns for global wires in giga-scale integration (GSI). In an exemplary embodiment, buffer insertion in a global wire which results in a delay close to time of flight $T_F$, may automatically lead to a robust design as $T_F$ by its nature may be almost independent of process variations. Delay induced crosstalk may also be overcome by the same phenomenon. Therefore, in an exemplary embodiment, layer 604 may be utilized in a top metal level for low-swing network/global on-chip communication. Such a system may surpass any on-chip optical interconnect system both in term of delay and power.

Example 1

In this example, communication at the speed of light by utilizing a 7 nm FinFET technology is demonstrated. For the 7 nm FinFET technology, the input capacitance and driver resistance of the minimum-size inverter (which is used as a buffer) are as $C_0 \approx 60$ aF and $R_0 \approx 7$ k$\Omega$, respectively. The strip-line structure of interconnects dictates that inductance L and capacitance C of the wires, and hence impedance $Z_0$ remains the same for all wires in different technologies, except for a little change due to the change in the aspect ratio of wires ($Z_0 \approx 90\Omega$). Time of flight $T_F$ also remains almost unchanged as it depends on the optimal distance between two buffers. While technology scales down, $C_L$ (which is the input capacitance of minimum size buffer, $C_0$) becomes much smaller than $T_F/Z_0$ and this causes jump in the voltage level at the end of the line. For the chosen technology node the ratio of $(C_L Z_0)/T_F$ is in the order of $10^{-4}$ for a 1 mm long global wire.

Figure 7:
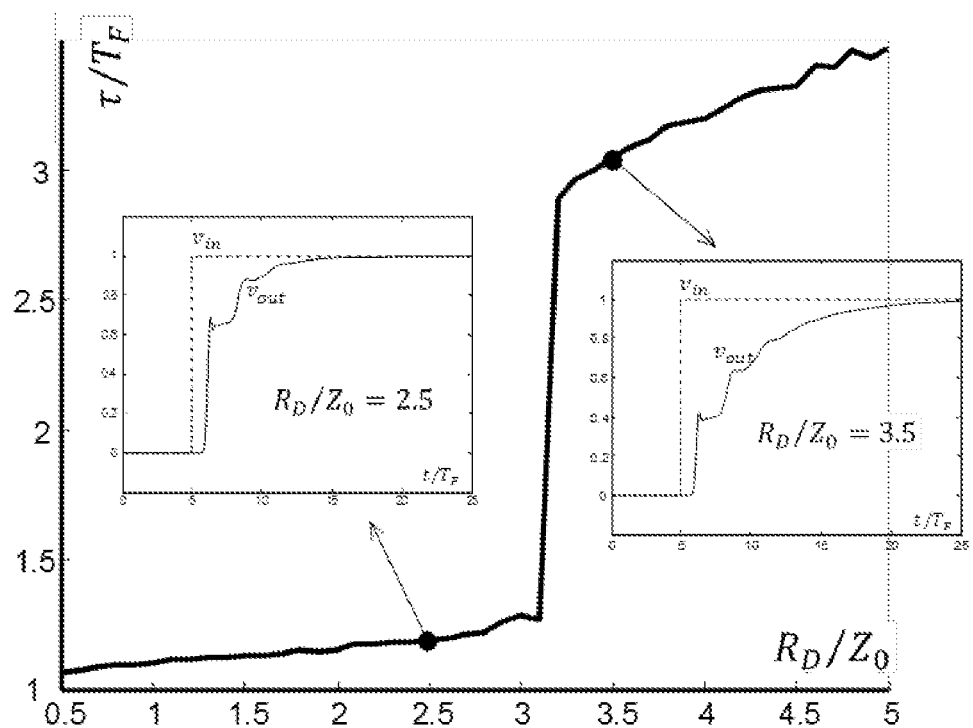
FIG. 7 shows a delay normalized to a time of flight for a 1 mm long global wire, consistent with one or more exemplary embodiments of the present disclosure.

FIG. 7 shows the delay normalized to the time of flight ($\tau/T_F$) for a 1 mm long global wire versus $R_D$ normalized to $Z_0$, consistent with one or more exemplary embodiments of the present disclosure. Step responses are plotted for two different values of $R_D$. This shows that for $R_D$ less than $3Z_0$, the delay is simply equal to $T_F$. The driver resistance of the tapered buffer may be empirically given by $$R_D = \frac{R_0}{h^{n-1}}.$$

HSPICE simulations may be used as supportive data as shown in TABLE 1.

TABLE 1

| h | n | $R_D$ (Simulation) ($\Omega$) | $R_D$ (Empirical) ($\Omega$) | Error (%) |
|---|---|---|---|---|
| 1 | 1 | 7.0641k | 7.0641k | 0 |
| 2 | 4 | 890.4562 | 883.0125 | −0.8359 |
| 3 | 4 | 261.2815 | 261.6333 | +0.1347 |
| 4 | 4 | 108.3818 | 110.3766 | +1.8405 |
| 5 | 4 | 57.1208 | 56.5128 | −1.0644 |
| 2 | 5 | 428.5443 | 441.5063 | +3.0246 |
| 3 | 5 | 86.2123 | 87.2111 | +1.1585 |
| 4 | 5 | 27.9243 | 27.5941 | −1.1823 |
| 2 | 6 | 217.5186 | 220.7531 | +1.4870 |
| 3 | 6 | 29.3818 | 29.0704 | −1.0599 |
| 2 | 7 | 110.2716 | 110.3766 | +0.0952 |
| 3 | 7 | 10.1887 | 9.6901 | −4.8934 |

Figure 8:
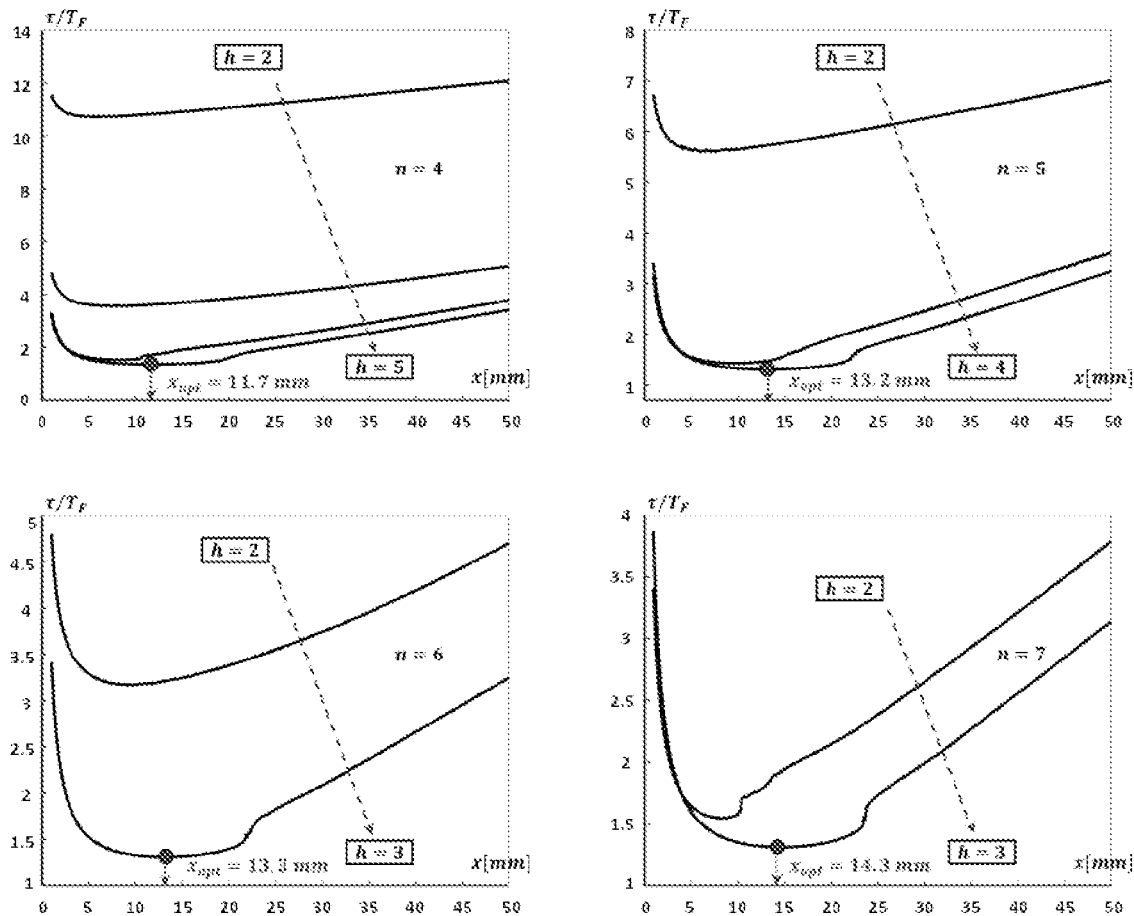
FIG. 8 shows the dependence of a delay over a time of flight on a length of a transmission line, consistent with one or more exemplary embodiments of the present disclosure.

FIG. 8 shows the dependence of the delay over the time of flight $\tau/T_F$ on the length of the transmission line x, consistent with one or more exemplary embodiments of the present disclosure. For $x > x_{opt}$, the line attenuation may become dominant, whereas for $x < x_{opt}$, the buffer delay may become dominant. Length x may be selected larger than $x_{opt}$ to save Silicon area and reduce power dissipation by a delay penalty, whereas choosing x around or smaller than $x_{opt}$ may result in a more robust design. As $x_{opt}$ is around 10 mm, the impact of via may be negligible.

Figure 9:
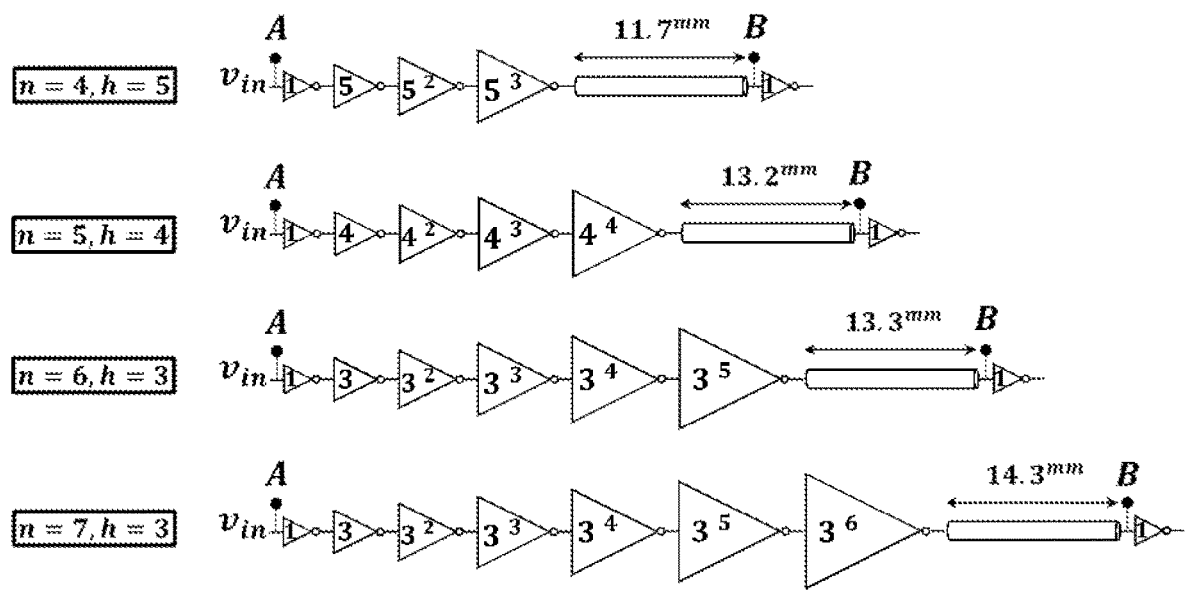
FIG. 9 shows cascaded buffers with different sizes along with corresponding optimized lengths, consistent with one or more exemplary embodiments of the present disclosure.
Figure 10:
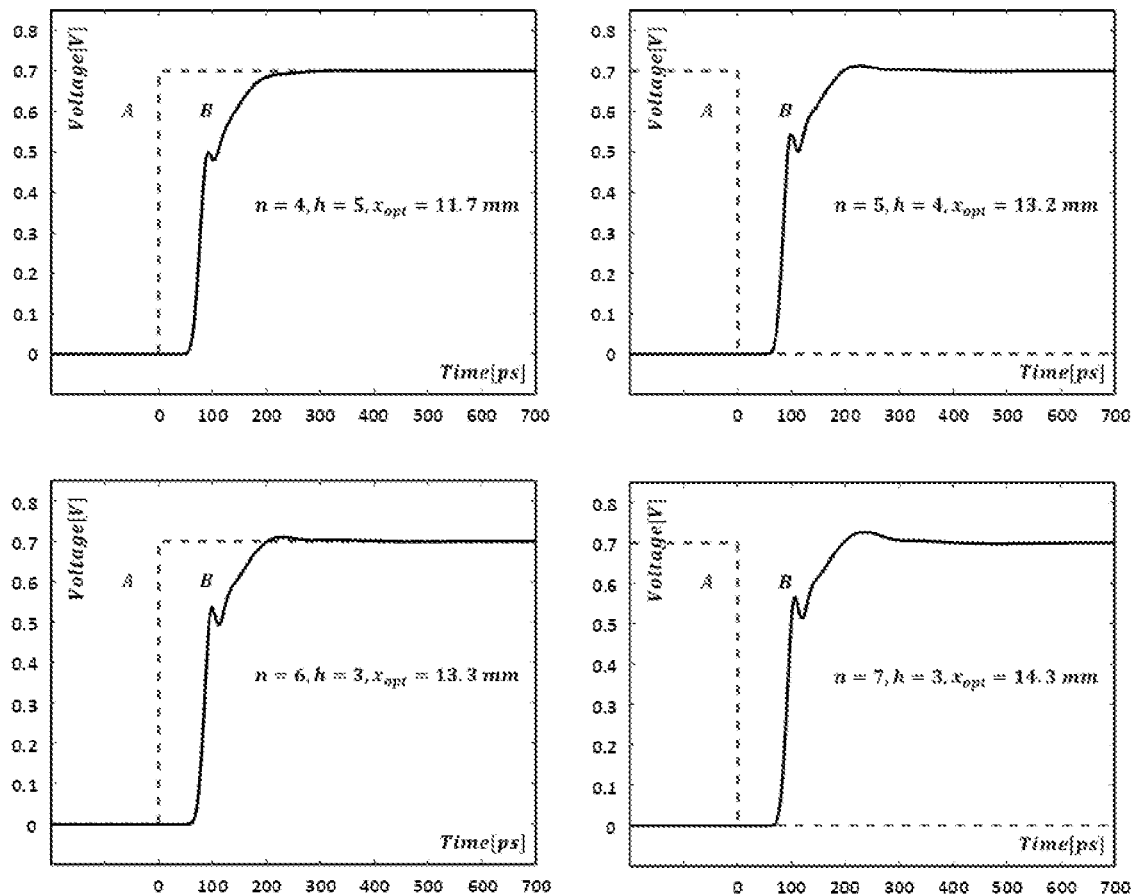
FIG. 10 shows step responses for different segments of an on-chip interconnect, consistent with one or more exemplary embodiments of the present disclosure.

TABLE 2 shows optimal design results of different segments of an exemplary on-chip interconnect for different values of h and n. FIG. 9 shows cascaded buffers with different sizes along with corresponding optimized lengths $x_{opt}$, consistent with one or more exemplary embodiments of the present disclosure. FIG. 10 shows step responses for different segments of the exemplary on-chip interconnect, consistent with one or more exemplary embodiments of the present disclosure. For h=3 and n=6, a $\tau/T_F$ of about 1.3115 can be obtained, which approximately equals the delay of an optical system with a refractive index of 1.9 and zero delays for electrical to optical and optical to electrical conversion.

TABLE 2

| h | n | $x_{opt}$ [mm] | $T_F$ [psec] | $\tau_{AB}/T_F$ | $E_D$ [fJ] | $E_{D\text{-}line}$ [%] |
|---|---|---|---|---|---|---|
| 5 | 4 | 11.7 | 57.8450 | 1.3630 | 502 | 95.6 |
| 4 | 5 | 13.2 | 65.2610 | 1.3127 | 573 | 94.4 |
| 3 | 6 | 13.3 | 65.7554 | 1.3115 | 583 | 93.5 |
| 3 | 7 | 14.3 | 70.6994 | 1.3115 | 648 | 90.4 |

TABLE 3 shows delay variations due to interconnect process variations. It is assumed that all interconnect geometrical values are suffering from $3\sigma=10\%$ variation of critical dimension (CD) by Gaussian distributions, where CD is the ITRS MPU half-pitch and $\sigma$ a is the standard deviation of delay distribution.

TABLE 3

| h | n | $x_{opt}$ [mm] | $\tau_{AB_{min}}/T_F$ | $\tau_{AB_{max}}/T_F$ | $3\sigma$ |
|---|---|---|---|---|---|
| 5 | 4 | 11.7 | 1.3573 | 1.4992 | 0.015055 |
| 4 | 5 | 13.2 | 1.3051 | 1.4415 | 0.019462 |
| 3 | 6 | 13.3 | 1.3038 | 1.3232 | 0.009633 |
| 3 | 7 | 14.3 | 1.3034 | 1.4274 | 0.018804 |

TABLE 4 summarizes results due to device process variations. It is assumed that gate length ($L_g$), fin thickness ($T_{Fin}$), fin height ($H_{Fin}$) and oxide thickness ($T_{ox}$) are about 11 nm, 6.5 nm, 18 nm, and 1.115 nm, respectively for the 7 nm FinFET technology, with $3\sigma=10\%$ variation in their nominal values expect for the oxide thickness which is 5%. All of these are modeled by Gaussian distribution.

TABLE 4

| h | n | $x_{opt}$ [mm] | $\tau_{AB_{min}}/T_F$ | $\tau_{AB_{max}}/T_F$ | $3\sigma$ |
|---|---|---|---|---|---|
| 5 | 4 | 11.7 | 1.3204 | 1.4917 | 0.071841 |
| 4 | 5 | 13.2 | 1.2830 | 1.3787 | 0.041946 |
| 3 | 6 | 13.3 | 1.2831 | 1.3773 | 0.040769 |
| 3 | 7 | 14.3 | 1.2838 | 1.3723 | 0.040369 |

Example 2

Figure 11A:
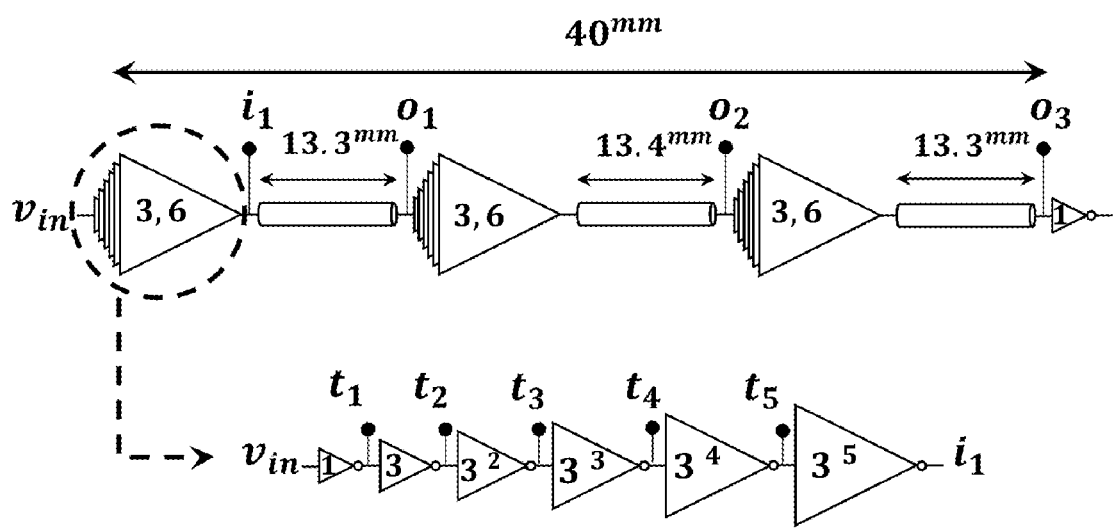
FIG. 11A shows a global wire divided into three segments, consistent with one or more exemplary embodiments of the present disclosure.
Figure 11B:
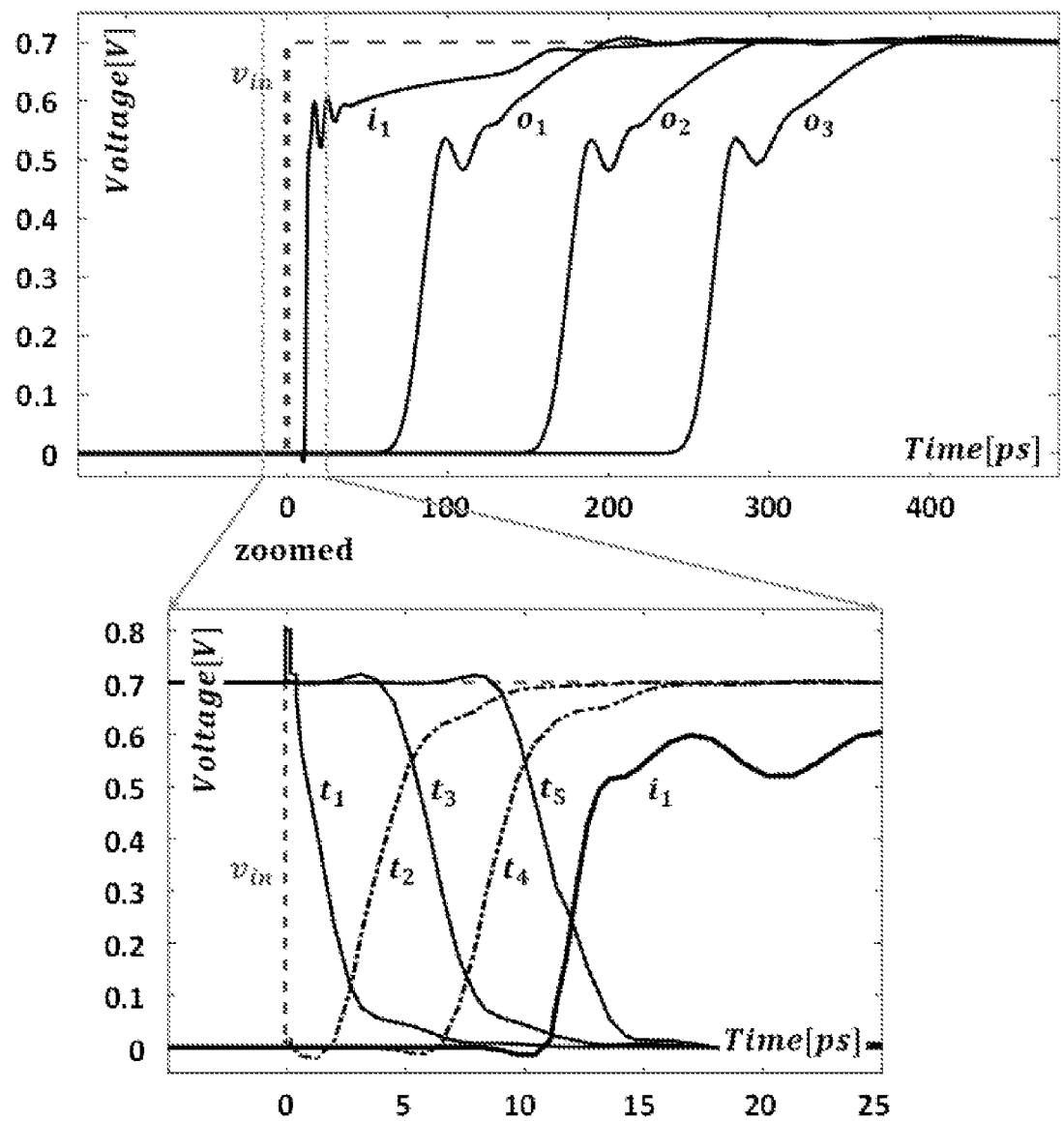
FIG. 11B shows voltage propagation along a global wire, consistent with one or more exemplary embodiments of the present disclosure.

In this example, voltage propagation along a 40 mm global wire is demonstrated. FIG. 11A shows a global wire divided into three segments with tapered buffers by h=3 and n=6, consistent with one or more exemplary embodiments of the present disclosure. The voltage at the end of each segment of an exemplary global wire 1100 jumps at the time-of-flight $T_F$. The propagation delay inside each chain of tapered buffers is a small fraction of $T_F$. FIG. 11B shows the voltage propagation along global wire 1100, consistent with one or more exemplary embodiments of the present disclosure.

Example 3

In this example, communication at the speed of light utilizing a 22 nm CMOS technology is demonstrated. TABLE 5 summarizes the optimization results. The parameter F is the ratio of width over length of a p-channel MOSFET (PMOS) to that of an n-channel MOSFET (NMOS).

TABLE 5

| h | n | F | $x_{opt}$ [mm] | $T_F$ [psec] | $\tau_{AB}/T_F$ | $E_D$ [fJ] | $E_{D\text{-}line}$ [%] |
|---|---|---|---|---|---|---|---|
| 5 | 4 | 3.1 | 9.70 | 47.9569 | 2.0161 | 698 | 94.4 |
| 4 | 5 | 3.2 | 11.3 | 55.8674 | 1.7131 | 837 | 91.5 |
| 3 | 6 | 3.0 | 12.2 | 60.3170 | 1.7193 | 930 | 88.9 |
| 3 | 7 | 2.8 | 15.0 | 74.1602 | 1.6477 | 1179 | 86.0 |

Example 4

Figure 12A:
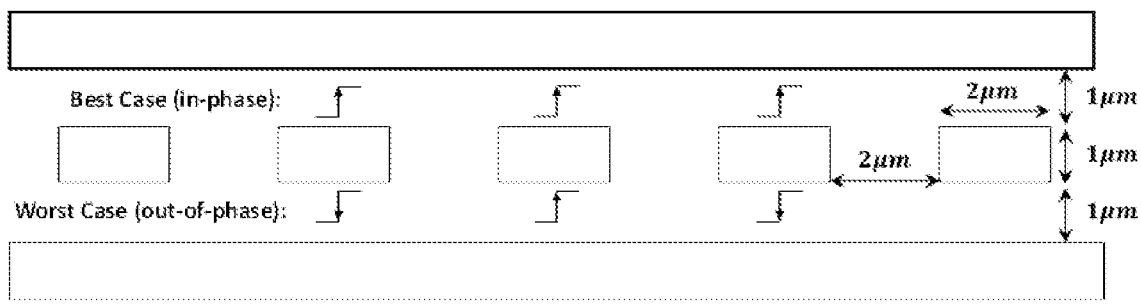
FIG. 12A shows a schematic of a global wiring system in which in- and out-of phase cases are represented, consistent with one or more exemplary embodiments of the present disclosure.
Figure 12B:
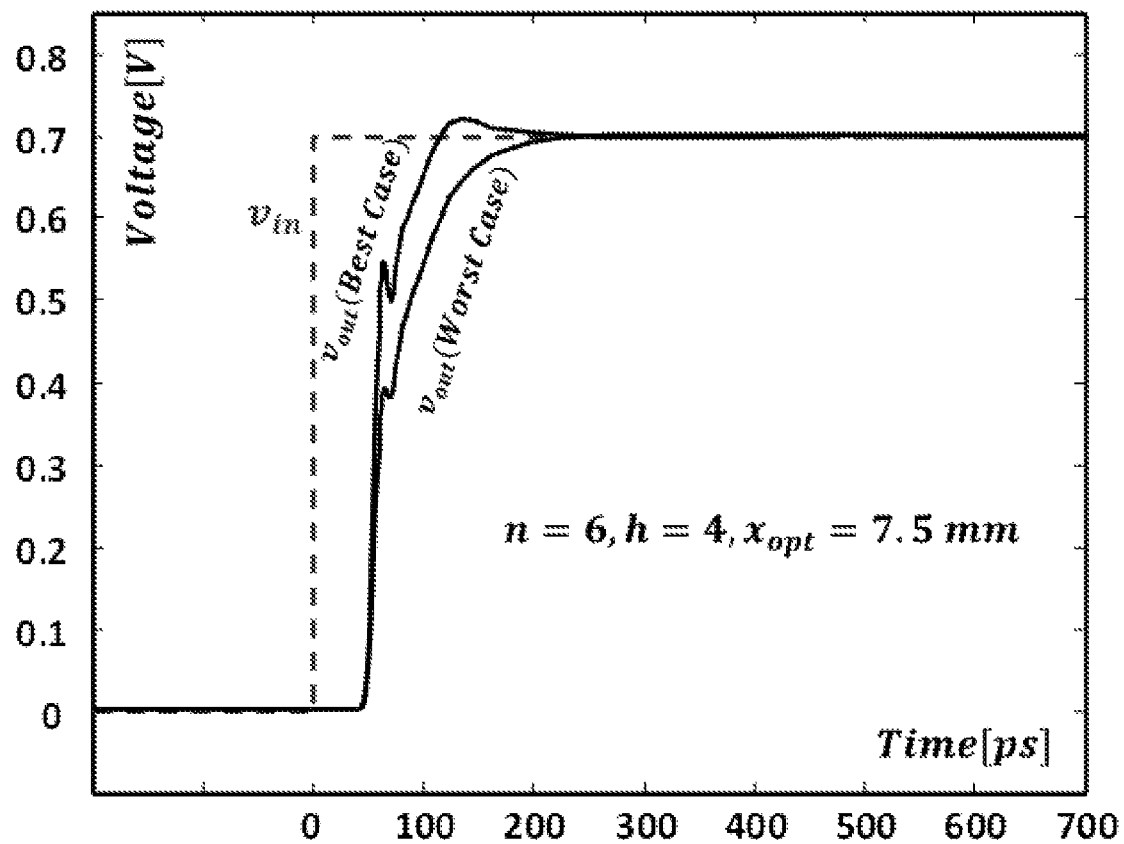
FIG. 12B shows step response of a global wiring system for best-case and worst-case scenarios, consistent with one or more exemplary embodiments of the present disclosure.

In this example, the impact of a wire's aspect ratio in a global wiring system on the crosstalk noise is demonstrated. FIG. 12A shows a schematic of a global wiring system 1200 in which in- and out-of phase cases are represented, consistent with one or more exemplary embodiments of the present disclosure. TABLE 6 shows optimal design results a bus with 5 global wires with a wire pitch of 4 um and an aspect ratio of ½. The terms worst-case and best-case refer to out-of-phase and in-phase signaling of adjacent wires, respectively. Per unit length parameters of such a bus will be as r=11 kΩ/m, l=150 nH/m, $l_m$=11.5 nH/m, $c_g$=140 pF/m, and $c_m$=12 pF/m, where l is self-inductance, $l_m$ is the mutual inductance of adjacent wires, $c_g$ is the ground capacitance, and $c_m$ is the mutual capacitance of adjacent wires. FIG. 12B shows step response of global wiring system 1200 for the best-case and the worst-case scenarios, consistent with one or more exemplary embodiments of the present disclosure. It shows how by reducing the aspect ratio, a time of flight transition over the wire may be achieved in the worst case scenario, whereas no overshoot is seen for the best case scenario.

TABLE 6

| h | n | $x_{opt}$ [mm] | $T_F$ [psec] | $\tau_{AB}/T_F$ Worst case | $\tau_{AB}/T_F$ Best case |
|---|---|---|---|---|---|
| 4 | 5 | 5.0 | 24.72 | 1.6981 | 1.6021 |
| 5 | 5 | 7.0 | 34.60 | 1.6592 | 1.5554 |
| 3 | 6 | 5.0 | 24.72 | 1.7330 | 1.6263 |
| 4 | 6 | 7.5 | 37.08 | 1.6377 | 1.5356 |
| 5 | 6 | 7.5 | 37.08 | 1.6934 | 1.6058 |
| 3 | 7 | 7.0 | 34.60 | 1.6272 | 1.5362 |
| 4 | 7 | 8.0 | 39.55 | 1.6848 | 1.5830 |

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for communication at the speed of light over an on-chip interconnect, the method comprising:
    dividing an on-chip interconnect into a plurality of segments, each of the plurality of segments comprising:
        a transmission line; and
        a tapered buffer connected to the transmission line, an input capacitance $C_L$ of the tapered buffer satisfying a capacitance condition according to:

$$Z_0 < 0.1 \times T_F/C_L,$$

where $Z_0$ is a characteristic impedance of the on-chip interconnect and $T_F$ is a time of flight over the on-chip interconnect;
    setting an aspect ratio of the on-chip interconnect to one half;
    placing the on-chip interconnect on a layer of a plurality of layers, the layer comprising a plurality of parallel interconnects;
    setting a distance between the on-chip interconnect and an adjacent interconnect of the plurality of parallel interconnects equivalent to a width of the on-chip interconnect; and
    setting a distance between the on-chip interconnect and an adjacent layer of the plurality of layers equivalent to a height of the on-chip interconnect.

2. The method of claim 1, wherein a driver resistance $R_D$ of the tapered buffer where $R_D < 3Z_0$.

3. The method of claim 1, further comprising determining a size of the tapered buffer by determining a size of a plurality of cascaded buffers according to:

$$S_i = h \times S_{i-1},$$

where:
        i is an integer number and $1 < i \leq N$, where N is the number of the plurality cascaded buffers,
        $S_i$ is a size of an $i^{th}$ buffer of the plurality of cascaded buffers,
        $S_1$ is a size of a first buffer of the plurality of cascaded buffers, and
        $h > 1$ is a taper ratio.

4. The method of claim 3, wherein the taper ratio satisfies a taper condition according to $h^{N-1} > 100$.

5. The method of claim 3, further comprising setting the size $S_1$ of the first buffer of the plurality of cascaded buffers to 1.

6. The method of claim 3, wherein determining the size of the plurality of cascaded buffers comprises determining a size of a plurality of cascaded inverters, an inverter of the plurality of cascaded inverters comprising a pair of transistors, each transistor of the pair of transistors comprising one of a metal-oxide-semiconductor field-effect transistor (MOSFET) and a fin field-effect transistor (FinFET).

7. The method of claim 6, wherein determining the size of the plurality of cascaded inverters comprises designing the FinFET according to a 7 nanometer (nm) technology node.

8. The method of claim 1, further comprising determining an optimized length of the transmission line by minimizing a ratio of a delay of the transmission line to the time of flight with respect to a length of the transmission line.

9. The method of claim 8, further comprising setting the length of the transmission line in a range between the optimized length and an upper limit corresponding to 10% higher than the minimized ratio of the delay of the transmission line to the time of flight.

10. An integrated circuit for communication at the speed of light over an on-chip interconnect, the integrated circuit comprising:
    an on-chip interconnect;
    a transmission line placed on the on-chip interconnect; and
    a tapered buffer connected to the transmission line, an input capacitance $C_L$ of the tapered buffer satisfying a capacitance condition according to:

$$Z_0 < 0.1 \times T_F/C_L,$$

where $Z_0$ is a characteristic impedance of the on-chip interconnect and $T_F$ is a time of flight over the on-chip interconnect;
    setting an aspect ratio of the on-chip interconnect to one half;
    placing the on-chip interconnect on a layer of a plurality of layers, the layer comprising a plurality of parallel interconnects;
    setting a distance between the on-chip interconnect and an adjacent interconnect of the plurality of parallel interconnects equivalent to a width of the on-chip interconnect; and
    setting a distance between the on-chip interconnect and an adjacent layer of the plurality of layers equivalent to a height of the on-chip interconnect.

11. The integrated circuit of claim 10, wherein a driver resistance $R_D$ of the tapered buffer satisfies a resistance condition according to $R_D < 3Z_0$.

12. The integrated circuit of claim 10, wherein the tapered buffer comprises a plurality of cascaded buffers, a size of each of the plurality of cascaded buffers defined by:

$$S_i = h \times S_{i-1},$$

where:
        i is an integer number and $1 < i \leq N$, where N is the number of the plurality cascaded buffers,
        $S_i$ is a size of an $i^{th}$ buffer of the plurality of cascaded buffers,
        $S_1$ is a size of a first buffer of the plurality of cascaded buffers, where $S_1$ is set to 1, and
        $h > 1$ is a taper ratio.

13. The integrated circuit of claim 12, wherein the taper ratio satisfies $h^{-1} > 100$.

14. The integrated circuit of claim 12, wherein the plurality of cascaded buffers comprises a plurality of cascaded inverters, an inverter of the plurality of cascaded inverters comprising a pair of transistors, each transistor of the pair of transistors comprising one of a metal-oxide-semiconductor field-effect transistor (MOSFET) and a fin field-effect transistor (FinFET).

15. The integrated circuit of claim 14, wherein a technology node associated with the plurality of cascaded inverters comprises a 7 nanometer (nm) FinFET technology.

16. The integrated circuit of claim 10, wherein a length of the transmission line is defined by a delay condition, the delay condition comprising a ratio of a delay of the transmission line to the time of flight minimized with respect to a length of the transmission line.

17. An integrated circuit for communication at the speed of light over an on-chip interconnect, the integrated circuit comprising a plurality of layers, a layer of the plurality of layers comprising a plurality of parallel on-chip interconnects, an on-chip interconnect of the plurality of parallel on-chip interconnects comprising a plurality of segments, each of the plurality of segments comprising:
- a transmission line, a length of the transmission line defined by a delay condition, the delay condition comprising a ratio of a delay of the transmission line to a time of flight over the on-chip interconnect minimized with respect to a length of the transmission line; and
- a tapered buffer connected to the transmission line, the tapered buffer comprising a plurality of cascaded buffers, each of the plurality of cascaded buffers comprising an inverter, the inverter comprising a pair of transistors, each transistor of the pair of transistors comprising one of a metal-oxide-semiconductor field-effect transistor (MOSFET) and a fin field-effect transistor (FinFET), a size of each of the plurality of cascaded buffers determined according to:

$S_i = h \times S_{i-1}$, where:
- i is an integer number and $1 < i \leq N$, where N is the number of the plurality cascaded buffers,
- $S_i$ is a size of an $i^{th}$ buffer of the plurality of cascaded buffers,
- $S_1$ is a size of a first buffer of the plurality of cascaded buffers, where $S_1$ is set to 1, and
- h>1 is a taper ratio, the taper ratio satisfying $h^{N-1} > 100$;

wherein:
an input capacitance $C_L$ of the tapered buffer satisfies a capacitance condition defined by:

$Z_0 < 0.1 \times T_F / C_L$, where $Z_0$ is a characteristic impedance of the on-chip interconnect and $T_F$ is the time of flight over the on-chip interconnect;

setting an aspect ratio of the on-chip interconnect to one half;

placing the on-chip interconnect on a layer of a plurality of layers, the layer comprising a plurality of parallel interconnects;

setting a distance between the on-chip interconnect and an adjacent interconnect of the plurality of parallel interconnects equivalent to a width of the on-chip interconnect;

setting a distance between the on-chip interconnect and an adjacent layer of the plurality of layers equivalent to a height of the on-chip interconnect; and a driver resistance $R_D$ of the tapered buffer satisfies a resistance condition where $R_D < 3 Z_0$.

18. The integrated circuit of claim 17, wherein a technology node associated with the pair of transistors comprises a 7 nanometer (nm) FinFET technology.

* * * * *